United States Patent [19]

Fukuda et al.

[11] 4,034,364
[45] July 5, 1977

[54] ANALOG-DIGITAL CONVERTER

[75] Inventors: Takeo Fukuda, Yokohama; Isao Tashiro, Kawasaki, both of Japan

[73] Assignee: Tokyo Shibaura Electric Co., Ltd., Japan

[22] Filed: Nov. 12, 1975

[21] Appl. No.: 631,051

[30] Foreign Application Priority Data

Dec. 10, 1974 Japan .................. 49-141178

[52] U.S. Cl. .................. 340/347 NT; 340/347 M; 324/99 D

[51] Int. Cl.² .................................. H03K 13/02

[58] Field of Search ............ 340/347 AD, 347 NT, 340/347 CC, 347 M; 324/99 D; 177/DIG. 3, 210

[56] References Cited

UNITED STATES PATENTS

| | | | |
|---|---|---|---|
| 3,895,376 | 7/1975 | Uchida | 340/347 NT |
| 3,906,486 | 9/1975 | Phillips | 340/347 NT |
| 3,942,174 | 3/1976 | Dorey et al. | 340/347 NT |
| 3,943,506 | 3/1976 | Peattie | 340/347 NT |
| 3,958,236 | 5/1976 | Kelly | 340/347 NT |

*Primary Examiner*—Thomas J. Sloyan
*Attorney, Agent, or Firm*—Oblon, Fisher, Spivak, McClelland & Maier

[57] ABSTRACT

An integrator consisting of a high gain D.C. amplifier, a voltage-current converter such as a resistor, and a feed-back capacitor. An unknown analog input voltage to be converted and two known reference analog voltages which have the same polarity as that of the input voltage to be converted are supplied to the voltage-current converter in the integrator through a first switching circuit having three switches. The output voltage of the integrator is supplied to a comparator. The comparator compares the integrated voltage with a fixed reference voltage and produces an output signal when both voltages are equal. A second switching circuit including one switch, a third switching circuit including two switches, and two capacitors respectively connected to the switches in the third switching circuit are provided between an output terminal of the integrator and ground. A voltage-current converter such as a resistor or a transistor circuit is connected between the input terminal of the D.C. amplifier and the interconnecting point of the second and third switching circuits. Each switch in the first, second and third switching circuits, is controlled by a switch control circuit. The switch control circuit includes counters, flip-flops, calculating circuits and delay circuits. A voltage corresponding to one of the two known reference voltages is stored in one of the two capacitors connected to the ground and a voltage corresponding to the other known reference voltage is stored in the other capacitor connected to the ground. A combined voltage of the input voltage and the voltage stored in one of the two capacitors and a combined voltage of one of the reference voltages and the voltage stored in the other capacitor are respectively integrated by the integrator. As a result thereof, a digital quantity representative of the ratio of the unknown input voltage and the difference between the two reference voltages is obtained by the switch control circuit.

8 Claims, 8 Drawing Figures

ANALOG-DIGITAL CONVERTER

BACKGROUND OF THE INVENTION

1. Field of the Invention:

This invention relates generally to an analog-digital converter which uses a dual slope method, and more particularly, to an analog-digital converter in which two known reference voltages whose polarities are the same as that of the unknown input voltage to be converted are used as the input voltages to the integrator.

2. Description of the Prior Art:

An analog-digital converter which uses a dual-slope method is known. This kind of converter basically comprises an integrator, a comparator, switching circuits and a switch control circuit. The integrator further includes a D.C. amplifier, an input resistor and a feed-back capacitor as shown in FIG. 1.

In this kind of converter, a known analog reference voltage having a polarity opposite to that of the analog input voltage to be converted is used as one of the input voltages to the integrator.

In FIG. 1, the analog input voltage to be converted $V_s$ is supplied to an input terminal $1a$ and analog reference voltage $-V_r$ whose polarity is opposite to that of the input voltage $V_s$ is supplied to an input terminal $1b$.

At first, the input terminal $1a$ is connected to a terminal 3 in the switch circuit 2 according to the output signal from a switching control circuit 9. As a result thereof, the input voltage $V_s$ is integrated by the integrator 4 consisting of the D.C. amplifier 5, the input resistor 6 and the feed-back capacitor 7.

The comparator 8 compares the level of the integrated voltage $V_o$ with the level of a fixed reference voltage $V_c$. After the input voltage $V_s$ is supplied to the amplifier 5 for the period $T_1$, the switching control circuit 9 generates a signal to the switching circuit 2 and the input terminal $1b$ is connected to the terminal 3. As a result thereof, the reference voltage $-V_r$ is integrated by the integrator 4.

FIG. 2 shows an integrated voltage $V_0$. In FIG. 2, $T_2$ is the period in which the reference voltage $-V_r$ is supplied to the integrator 4. $T_1$ is a predetermined period and $T_2$ is a period measured in the switch control circuit 9.

In this case, if the D.C. amplifier 5 has not offset, the following relative equation is applicable $$\frac{V_s}{V_r} = \frac{T_2}{T_1}$$

$T_1$ and $T_2$ are measured by counting the clock pulses in the switching control circuit 9. Consequently, the ratio $V_s/V_r$ can be obtained as the ratio $T_2/T_1$ and the digital quantity of the analog voltage $V_s$ may be obtained.

However, the D.C. amplifier 5 generally has an offset. Therefore, the above relative equation is not applicable. Instead, the following relative equation is applicable $$\frac{V_s}{V_r} = \left(1 - \frac{\Delta V}{V_r}\right)\frac{T_2}{T_1} - \frac{\Delta V}{V_r}$$

where $\Delta V$ is the offset voltage of the D.C. amplifier 5.

Consequently, the ratio $V_s/V_r$ cannot be obtained as the ratio $T_2/T_1$.

Therefore, manual adjustment of the D.C. amplifier 5 is necessary to compensate for $\Delta V$. Moreover, it is necessary to carry out a zero-adjustment and a full-scale adjustment everytime prior to actual measurement because the offset voltage $\Delta V$ varies as a result of the temperature or as a result of other circumstances.

In order to automatically compensate for the offset voltage $\Delta V$ the following method has been suggested. Namely, as shown in FIG. 3, a serial connection circuit of switching circuit 11 and capacitor 12 is provided between the output terminal of the integrator 4 and the ground, and the interconnecting point of the serial circuit is connected to a gate terminal of a field-effect transistor (FET) 13. And further, a source terminal of the FET 13 is connected to a terminal 14 in the switching circuit 2.

In this construction, at first, the terminal 14 is connected to the terminal 3 and the switching circuit 11 is closed. As a result thereof, the current $\Delta V/R$ flows through the input resistor 6 and the feed-back capacitor 7 is charged. When the circuit assumes its stationary state, the voltage level of an input terminal 15 of the D.C. amplifier 5 and the level of the source terminal of the FET 13 are equal to each other. Therefore, current does not flow through the input resistor 6. Under this situation, the voltage level of the source terminal of the FET 13 is equal to $-\Delta V$.

Subsequently, the switching circuit 11 is opened and a terminal 16 is connected to the terminal 3 by the output signal from the switching control circuit 9. Therefore, the voltage $(V_s - \Delta V)$ is integrated by the integrator 4.

This integration operation is continued for the period $T_1$. After that, the terminal 17 is connected to the terminal 3 and then the voltage $(-V_r - \Delta V)$ is integrated. This integration operation is continued until the comparator 8 generates the output signal.

In this case, the following relative equation is applicable.

$$(V_s \Delta V + \Delta V) T_1 + (-V_r - \Delta V + \Delta V) T_2 = 0$$

where $T_2$ is the period in which the voltage $(-V_r - \Delta V)$ is integrated.

Therefore, the following relative equation can be obtained.

$$\frac{V_s}{V_r} = \frac{T_2}{T_1}$$

This method shows that the opposite polarity voltage $-\Delta V$ is previously obtained and, in the actual measuring operation, the combined voltage of $V_s$ and $-\Delta V$ or $-V_r$ and $-\Delta V$ in integrated.

Consequently, according to this method, the zero-adjustment and full-scale-adjustment are automatically carried out.

In the above-mentioned prior art, however, it is necessary that the polarities of the converted voltage $V_s$ and standard voltage $-V_r$ be opposite each other. Generally, two voltage sources are required in order to obtain two voltages of different polarities. In this case, it is quite difficult to maintain the two voltages at predetermined levels. Further, the abberations of the two voltages have a direct effect upon the digital quantities of the converted voltage even though the D.C. amplifier does not have the offset.

Furthermore, even when two voltages of opposite polarity are obtained from one voltage source, it is quite difficult to maintain the voltages at predetermined levels because of the abberration generated by the polarity converter, which abberration directly affects the accuracy of the A-D conversion.

SUMMARY OF THE INVENTION

Accordingly, it is an object of the present invention to provide a new and improved analog-digital converter.

Another object of the present invention is to provide a new and improved analog-digital converter in which two standard analog voltages having polarities the same as that of a voltage to be converted and used.

Briefly, according to the invention, an unknown analog voltage to be converted and two known reference voltages having the same polarity as that of the unknown analog voltage to be converted are supplied to an integrator including a D.C. amplifier through a first switching circuit.

In order to maintain the voltages corresponding to the respective reference voltages, a second switching circuit, a third switching circuit and two capacitors are provided.

In the actual measuring operation, a combined voltage of the voltage to be converted and the voltage maintained in one of the two capacitors and a combined voltage of one of the reference voltages and the voltage maintained in the other of the capacitors are integrated by the integrator.

BRIEF DESCRIPTION OF THE DRAWINGS

Various objects, features and attendant advantages of the present invention will be more fully appreciated as the same becomes better understood from the following detailed description of the present invention when considered in connection with the accompanying drawings, in which.

DETAILED DESCRIPTION OF THE PREFERRED EMBODIMENTS

Figure 4:
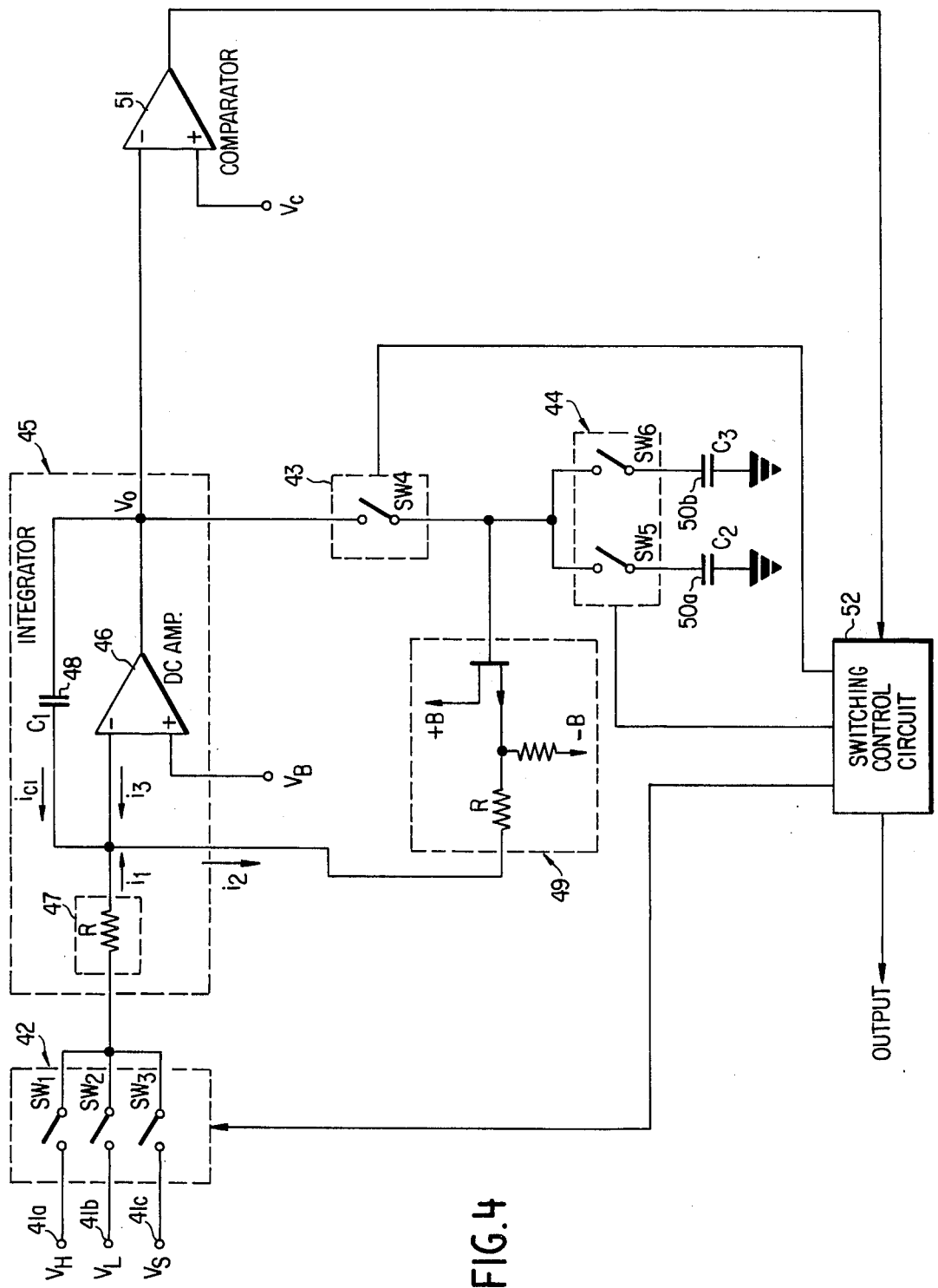
FIG. 4 is a diagram showing a preferred embodiment of an analog-digital converter in accordance with the present invention.

Referring now to the drawings, wherein like reference numerals designate identical or corresponding parts throughout the several views, and more particularly to FIG. 4 thereof, the preferred embodiment of the present invention is diagrammatically illustrated in FIG. 4.

In FIG. 4, two reference voltage $V_H$ and $V_L$ are respectively supplied to unput terminals 41a and 41b and an unknown voltage to be converted $V_s$ is supplied to an input terminal 41c. The polarity of the two reference voltages $V_H$ and $V_L$ and the voltage $V_S$ are the same. The level of $V_S$ is selected between the levels of $V_H$ and $V_L$. Thus, the relation among the three voltages is $V_H > V_S > V_L$.

The operation of this converter is described as follows with reference to FIGS. 4, 5A and 5B.

At first, at the time $t=t_0$, a switch $SW_1$ in the first switching circuit 42, a switch $SW_4$ in the second switching circuit 43 and a switch $SW_5$ in the third switching circuit 44 are respectively closed. As a result thereof, the reference voltage $V_H$ is supplied to an integrator 45 having a D.C. amplifier 46, a voltage-current converter such as a resistor 47 and a feed-back capacitor 48. The D.C. amplifier 46 has high amplification. A reference voltage $V_B$ supplied to the positive input terminal of the D.C. amplifier 46 has a value selected between $V_H$ and $V_L$. This condition is continued until the circuit assumes its stationary state.

When the circuit assumes its stationary state, the current $i_{C1}$ flowing in the feed-back capacitor 48 equal to zero and the following relative equation is applicable $$i_2 = i_1 + i_3$$

where $i_2$ is the current which flows in a voltage-current converter 49 having a resistor and a buffer circuit connected between the negative input terminal of the D.C. amplifier 46 and the third switching circuit 44; $i_1$ is the current which flows in the V-I converter 47; and, $i_3$ is the offset current of the D.C. amplifier 46.

On the assumption that $i_1$ is equal to $i_{1V_H}$ and $i_2$ is equal to $i_{2v_H}$, the above relative equation should be changed as follows:

$$i_{2V_H} = i_{1V_H} + i_3$$

In this state, the voltage corresponding to the output voltage $V_O$ (which is assumed to be $V_{OV_H}$) of the D. C. amplifier 46 is charged in a capacitor 50a connected between the switch $SW_5$ and the ground. The level of the voltage $V_{OV_H}$ is lower than the level of the voltage $V_C$ supplied to one of the input terminals of a comparator 51 as shown in FIG. 5A.

At the time $t=t_1$, a switch $SW_2$ in the first switching circuit 42, a switch $SW_4$ in the second switching circuit 43 and a switch $SW_6$ in the third switching circuit 44 are closed. As a result thereof, the reference voltage $V_L$ is supplied to the integrator 45. This condition is continued until the circuit assumes its stationary state.

When the circuit assumes its stationary state, the following relative equation is applicable $$i_{2V_L} = i_{1V_L} + i_3$$

where $i_{2V_L}$ is the current $i_2$ in the period when $V_L$ is integrated; and, $i_{1V_L}$ is the current $i_1$ in the period when $V_L$ is integrated.

In this state, the voltage corresponding to the output voltage $V_O$ (Which is assumed to be $V_{OV_L}$) of the D.C. amplifier 46 is charged in capacitor 50b connected between the switch $SW_6$ and the ground. The level of the voltage $V_{OV_L}$ is higher than the level of the voltage $V_C$ as shown in FIG. 5A. Namely, the voltage $V_C$ is selected between the levels of $V_{OV_L}$ and $V_{OV_L}$.

At the time $t=t_2$, the switch $SW_4$ in the second switching circuit 43 is opened, and the switch $SW_3$ in the first switching circuit 42 and the switch $SW_6$ in the third switching circuit 44 are closed. As a result thereof, a combined voltage $V_S$ and the voltage stored in condenser 50b is supplied to the integrator 45.

In this state, the current $I_2$ is $i_{2V_L}$ ($=i_{1V_L} + i_3$). Therefore, assuming that the present current $i_1$ is $i_{1V_S}$, the following relative equation is obtained.

$$I_{C1} = i_{2V_L} - i_{1V_S} - i_3 = i_{1V_L} - i_{1V_S} \tag{1}$$

Figure 5A:
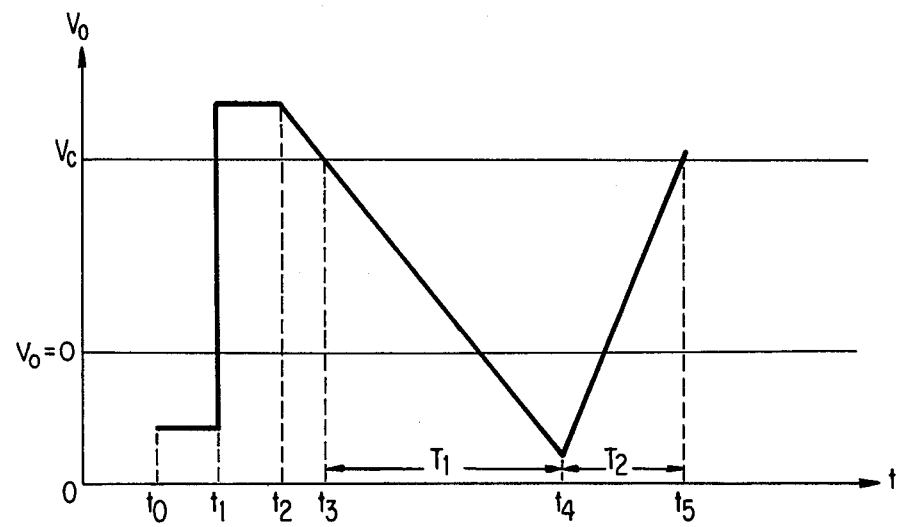
FIG. 5A is a diagram showing an integrated voltage in accordance with the present invention.
Figure 5B:
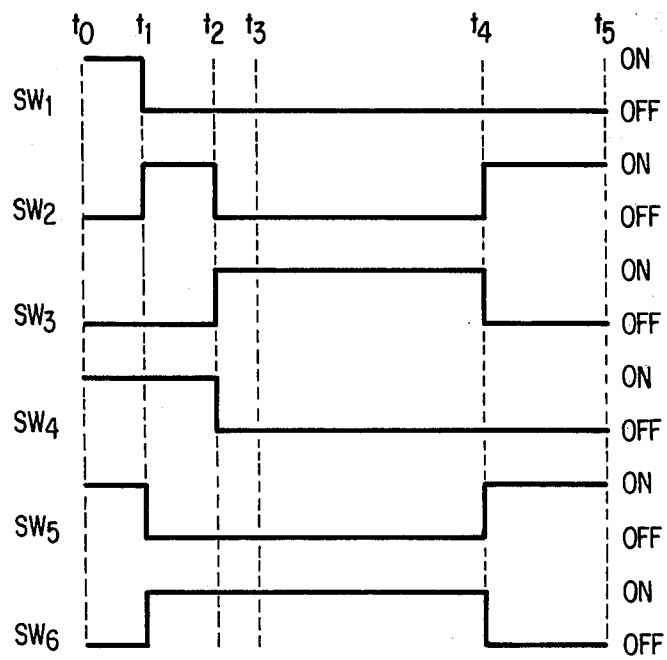
FIG. 5B is a diagram showing the status of each switch in the present invention.

Therefore, the output voltage $V_0$ of the integrator 45 decreases linearly as shown in FIG. 5A and the output voltage $V_0$ of the integrator 45 at the time $t=t_4$ is as follows:

$$V_0(t=t_4) = C_1(i_{1V_L} - i_{1V_S}) T_1 + V_0(t=t_3) \tag{2}$$

where $C_1$ is the capacity of the feed-back capacitor 48; $V_0(t=t_3)$ is the output voltage level of the D.C. amplifier 46 at the time $t=t_3$, and is equal to $V_C$ which is supplied to the comparator 51; and, $T_1$ is the period from $t=t_3$ to $t=t_4$.

Subsequently, at the time $t=t_4$, the switch $SW_2$ in the first switching circuit 42 and the switch $SW_5$ in the third switching circuit 44 are closed. As a result thereof, a combined voltage of reference voltage $V_L$ and the voltage stored in the capacitor 50a is supplied to the integrator 45.

In this state, the current $i_2$ is $i_{2V_H}$ ($=i_{1V_H} + i_3$) and the voltage $V_{OV_H}$ is stored in the condenser 50a. Therefore, the current $i_{c1}$, which flows in the feed-back capacitor 48, is as follows, $$I_{c1} = i_{2V_H} - i_{1V_L} - i_3 \tag{3}$$

Therefore, the output voltage $V_0$ of the integrator 45 increases linearly as shown in FIG. 5A.

At the time $t=t_5$, the output voltage $V_0$ of the integrator 45 is as follows:

$$V_{0(t=t_5)} = C_1(i_{1V_H} - i_{1V_L}) T_2 + V_{0(t=t_4)} \tag{4}$$

where $V_{0(t=t_4)}$ is the output voltage level of the D.C. amplifier 46 at the time $t = t_4$; $V_{0(t=t_4)}$ is equal to $V_{0(t=t_3)}$, and is also equal to $V_C$; and, $T_2$ is the period from $t = t_3$ to $t = t_5$.

Consequently, the following relative equation is obtained from equations (2) and (4).

$$C_1(i_{1V_L} - i_{1V_S}) T_1 + C_1(i_{1V_H} - i_{1V_L}) T_2 = 0$$

$$\frac{i_{1V_L} - i_{1V_S}}{i_{1V_H} - i_{1V_L}} = \frac{T_2}{T_1} \tag{5}$$

where $$i_{1V_S} = \frac{V_S - V_0}{R}$$

$$i_{1V_H} = \frac{V_H - V_0}{R}$$

$$i_{1V_L} = \frac{V_L - V_0}{R}$$

Therefore, finally, the following relative equation is applicable.

$$\frac{V_S - V_L}{V_H - V_L} = \frac{T_2}{T_1} \tag{6}$$

$$\therefore V_S = (V_H - V_L)\frac{T_2}{T_1} + V_L \tag{7}$$

In equations (6) and (7), $T_1$ is a predetermined period and $T_2$ may be obtained by measurement. Therefore, it is possible to obtain the digital quantities of the voltage $V_S$ as the ratio $T_2T_1$.

It is to be understood that the offset current or offset voltage of the D.C. amplifier 45 does not effect the digital quantities obtained by the converter of the present invention.

The operation of the switches $SW_1$, $SW_2$, $Sw_3$, $SW_4$, $SW_5$ and $SW_6$ are respectively controlled by a switch control circuit 52. The digital quantities of the voltage $V_S$ are obtained by the switching control circuit 52.

The details of the switching control circuit 52 are as follows.

Figure 6:
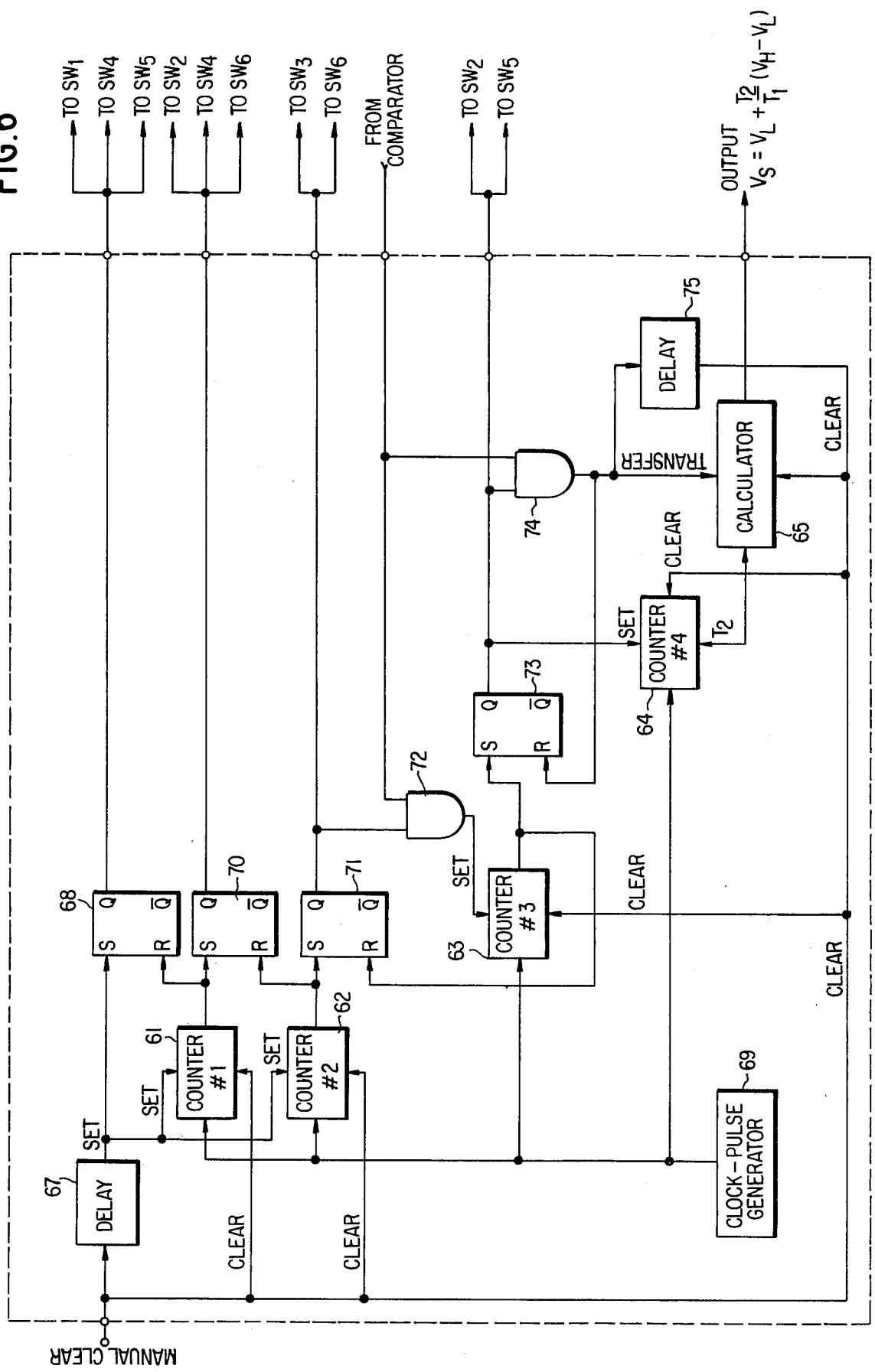
Fig. 6 is a diagram showing the details of a switching control circuit in the present invention.

FIG. 6 shows a diagram of the switching control circuit 52. In the circuit shown in FIG. 6, all counters 61, 62, 63 and 64 and a calculator 65 are cleared by a clear pulse generated by a manual-clear terminal 66. This clear pulse is also supplied to a delay circuit 67. The circuit 67 delays passing the clear pulse for an appropriate period.

The signal generated by the delay circuit 67 is supplied to the set terminals of a flip-flop 68 and the counters 61 and 62.

As a result thereof, a Q-terminal of the flip-flop 68 generates an output signal 1 and the counters 61 and 62 start counting the clock pulse transferred from a clock-pulse generator 69. The output signal generated by the flip-flop 68 is supplied to switches $SW_1$, $SW_4$ and $SW_5$ in order to close these switches.

After the predetermined period, the counter 61 generates an output signal. At this moment, the counter 62 is still continuing the counting operation. The moment at which the counter 61 generates the output signal corresponds to the time $t=t_1$.

The output signal of the counter 61 is supplied to the reset terminal of the flip-flop 68 and to the set terminal of a flip-flop 70. As a result thereof, the switches $SW_1$ and $SW_5$ are opened and the switches $SW_2$, $SW_4$ and $SW_6$ are closed.

After the predetermined period, the counter 62 produces an output signal. The moment at which the counter 62 generates the output signal corresponds to the time $t=t_2$.

As a result of the output signal being generated by the counter 62, the flip-flop 70 is reset and a flip-flop 71 is set. Consequently, the switches $SW_2$ and $SW_4$ are opened and the switches $SW_3$ and $SW_6$ are closed.

The period of the count operation of the counters 61 and 62 may be respectively determined on the basis of the stability of the circuit.

As a result of the switches $SW_3$ and $Sw_6$ being closed, the output voltage $V_0$ of the integrator 45 linearly decreases as shown in FIG. 5A.

At the time $t=t_3$, a signal generated by the comparator 51 is supplied to an AND gate 72. Therefore, the AND gate 72 supplies an output signal to a set terminal of the counter 63, and the counter 63 starts the count operation.

After the counter 63 counts the clock pulses for the period $T_1$, the counter 63 generates an output signal.

The flip-flop 71 is reset and a flip-flop 73 is set by the output signal produced from the counter 63. The time at which the counter 63 supplies the output signal corresponds to the time $t=t_4$.

As a result thereof the switches $SW_3$ and $SW_6$ are opened and the switches $SW_2$ and $SW_5$ are closed. At this moment, the output voltage $V_O$ of the integrater 45 starts increasing as shown in FIG. 5A.

The output signal of the counter 63 is also supplied to the counter 64 as a set signal. Therefore, the counter 64 starts to count the clock pulses.

At the time $t=t_5$, the comparator 51 generates an output signal. This output signal is supplied to a reset terminal of the flip-flop 73 and to the calculator 65 through an AND gate 74. Consequently, the counter 64 transfers the contents therein (or the count number showing the period $T_2$) to the calculator 65.

The calculator 65 comprises certain registers including a register in which the digital quantities corresponding to the term $T_1$ are registered. The calculator 65 further comprises an operating circuit for the four fundamental rules of arithmetic.

The digital quantities of the voltage $V_S$ are obtained by the calculator 65 on the basis of the afore-mentioned relative equation (7).

A delay circuit 75 delays the output signal of the AND gate 74 for an appropriate period and then generates an output signal. This output signal is supplied to the counters 61, 62, 63 and 64, to the calculator 65 and to the delay circuit 67 as a clear pulse.

After the clear pulse is supplied to the delay circuit 68, the switch control circuit 52 may automatically repeat the operation in the same manner as mentioned above.

According to the present invention, as mentioned above, the unknown voltage to be converted $V_S$ and two known reference voltages $V_H$ and $V_L$ having the same polarity as that of the voltage $V_S$ are supplied to the integrator 45. The voltage corresponding to the integrated voltages $V_H$ and $V_L$ are respectively stored in the capacitors 50a and 50b. In the actual-measuring operation, the combined voltage of the voltage corresponding to the voltage $V_{OV_L}$ and the voltage $V_S$ is integrated for the predetermined period $T_1$. After that, the combined voltage of the voltage corresponding to the voltage $V_{OV_H}$ and the voltage $V_L$ is supplied to the integrator 45 in order to obtain the period $T_2$.

Therefore, it is possible to secure three voltages $V_S$, $V_H$ and $V_L$ from one voltage source. Furthermore, the polarity-converter is not required in the present invention. Therefore it is clear that not only does the aberration caused by the offset of the D.C amplifier not affect the quantities of the A-D conversion, but, the aberrations of the reference voltage are of no consequence.

Figure 1:
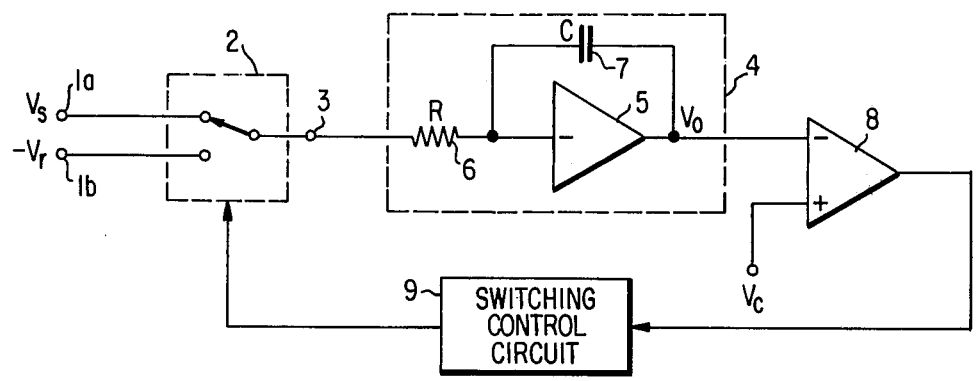
FIG. 1 is a diagram showing a fundamental circuit of an analog-digital converter using the dual-slope method.
Figure 2:
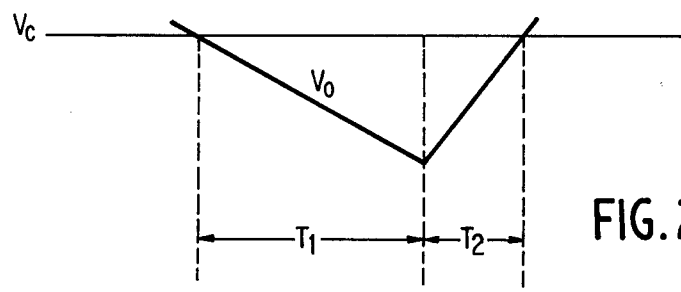
FIG. 2 is a diagram showing an output voltage of the integrator in FIG. 1.
Figure 3:
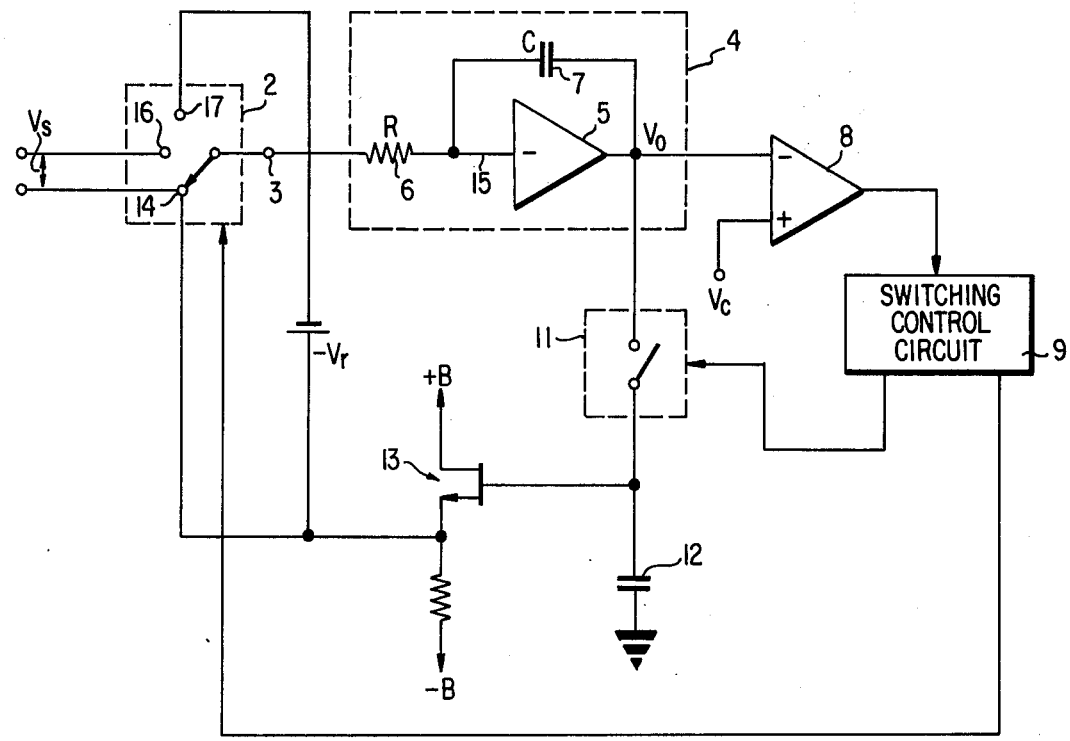
FIG. 3 is a diagram showing another prior analog-digital converter circuit.

Further, it is obvious that the zero adjustment and the full-scale-adjustment are automatically effected in the same manner as the apparatus shown in FIG. 3.

Furthermore, the reference voltages $V_B$ and $V_C$ respectively supplied to the D.C. amplifier 46 and the comparator 51 may be of the same polarity as that of the voltages $V_S$, $V_H$ and $V_L$.

Consequently, it is possible to operate the converter of the present invention using only one voltage source. As a result thereof, converter miniaturization can be realized.

Figure 7:
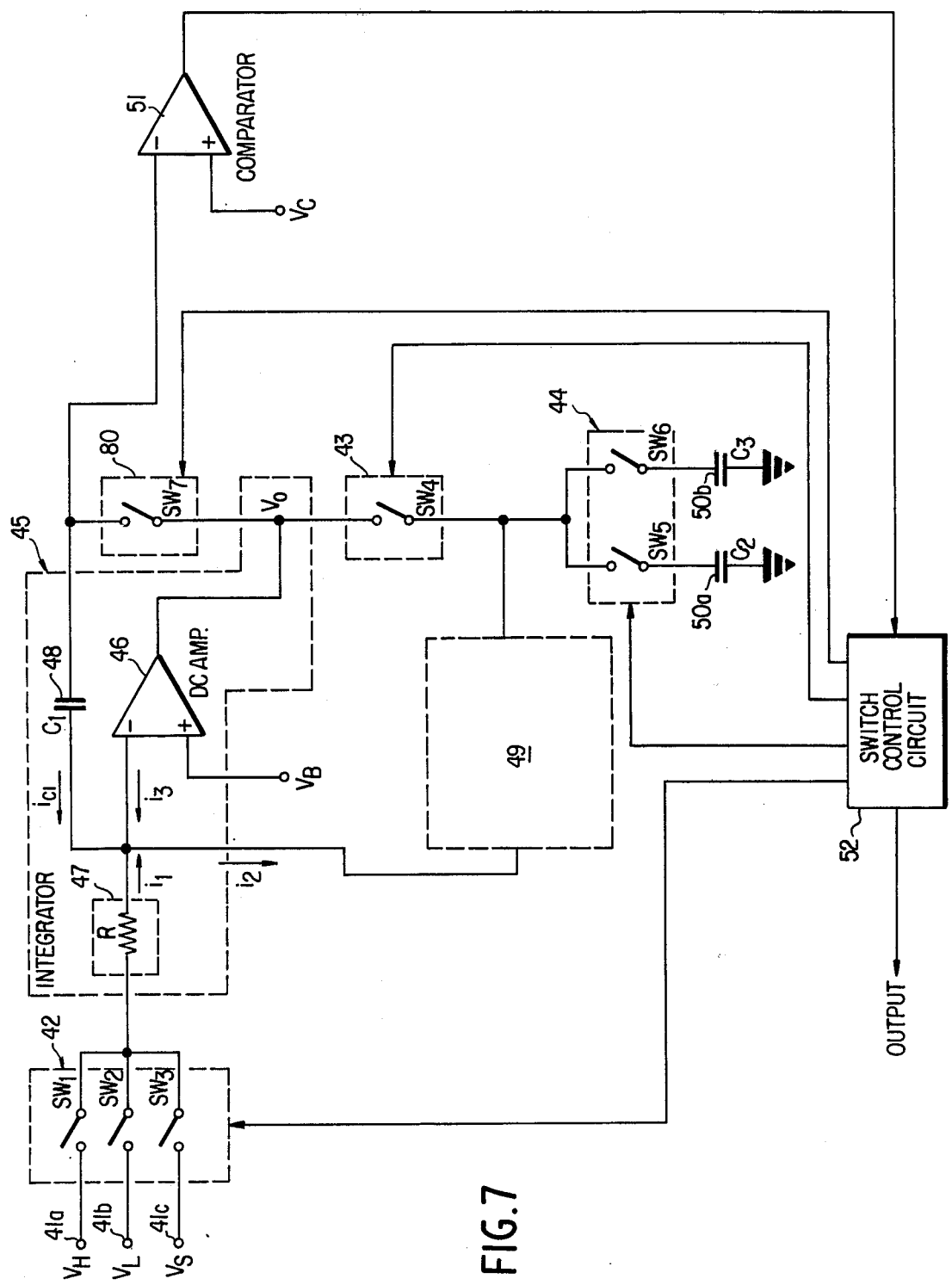
FIG. 7 is a diagram showing another embodiment of an analog-digital converter in accordance with the present invention.

FIG. 7 shows another preferred embodiment of the present invention wherein like reference numerals refer to or designate identical or corresponding parts as that shown in FIG. 4.

In this arrangement, a switching circuit 80 is provided between the output terminal of the D.C. amplifier 46 and the input terminal of the comparator 51. A switch $SW_7$ in the switching circuit 80 is opened for the period from $t = t_0$ to $t = t_2$ by the output signal produced from the switching control circuit 52. As a result thereof, the period from the moment when the reference voltages $V_H$ and $V_L$ are supplied to the D.C. amplifier 46 to the moment when the circuit assumes its stationary state is easily abbreviated.

It is believed clear that the switching circuit 80 does not affect the result of the A-D conversion even if the switch $SW_7$ has a conductive resistance.

The above explanation has been for the case when the level of the voltage to be converted $V_S$ is between the level of the reference voltage $V_H$ and the level of the reference voltage $V_L$. However, the operation of the converter of the present invention need not necessarily be so related to the levels of these three voltages.

For example, in the case when the level of the voltage $V_S$ is higher than that of the reference voltage $V_H$, the decreasing gradient of the integrated voltage $V_O$ should be steeper during the period from $t=t_2$ to $t=t_4$.

In FIGS. 4 and 7, the V-I converters 47 and 49 may be replaced with resistors. All switches $SW_1$, $SW_2$, $SW_3$, $SW_4$, $SW_5$ $SW_6$ and $SW_7$ may be electrical, electronic or mechanical switches. In FIG. 6, all counters may be replaced with at least one register.

Obviously, numerous modifications and variations of the present invention are possible in light of the above teachings. It is therefore to be understood that within the scope of the appended claims, the invention may be practiced otherwise than as specifically described herein.

What is claimed as new and desired to be secured by Letters Patent of the United States is:

1. An analog-digital converter comprising:
   a D.C. amplifier;
   a first voltage-current converter connected to an input terminal of the D.C. amplifier,
   a feed-back capacitor connected between the input terminal of the D.C. amplifier and an output terminal of the D.C. amplifier,
   a first switching circuit for supplying an unknown analog voltage to be converted and first and second analog reference voltages having the same polarity as that of the converted voltage to the first voltage-current converter,
   a serial connection circuit of a second switching circuit and a second voltage-current converter connected between the output terminal of the D.C. amplifier and the input terminal of the D.C. amplifier,
   a third switchng circuit having two switches with one of the switches being connected to an inter-connecting point of the serial connection circuit;
   a first capacitor connected between one of the two switches in the third switching circuit and ground to maintain a first voltage corresponding to an output voltage of the D.C. amplifier in the period when only the first reference voltage is supplied to the D.C. amplifier,
   a second capacitor connected between one of the switches in the third switching circuit and ground to maintain a second voltage corresponding to an output voltage of the D.C. amplifier during the period when only the second reference voltage is supplied to the D.C. amplifier, a comparator for producing an output signal when the levels of the output voltage of the D.C. amplifier are equal to the level of a reference voltage and a switch control circuit for controlling the first, second and third switching circuits to maintain the first and second voltages corresponding to the output voltages of the D.C. amplifier respectively in the first and second capacitors, to supply a first combined voltage of the second voltage corresponding to the output voltage of the D.C. amplifier and the unknown analog voltage to be converted to the D.C. amplifier for a predetermined period, to supply a second combined voltage of the first voltage corresponding to the output voltage of the D.C. amplifier and the second reference voltage to the D.C. amplifier and to obtain a digital quantity of the unknown analog voltage to be converted by measuring the period in which the second combined voltage is supplied to the D.C. amplifier.

2. An analog-digital converter according to claim 1 wherein the first voltage-current converter is a resistor.

3. An analog-digital converter according to claim 1 wherein the second voltage-current converter comprises a resistor and a buffer circuit.

4. An analog-digital converter according to claim 1 wherein the switches in the first, second and third switching circuits are electronic switches.

5. An analog-digital converter according to claim 1 wherein said switch control circuit comprises:
a clock-pulse generator,
a first counter for determining the end of the period during which only the first reference voltage is supplied to the D.C. amplifier by counting a clock pulse generated by the clock-pulse generator,
a second counter for determining the end of the period during which only the second reference voltage is supplied to the D.C. amplifier by counting a clock pulse generated by the clock-pulse generator.
a third counter for counting a clock pulse generated by the clock-pulse generator for a predetermined period after the comparator generates an output signal when a combined voltage of the unknown analog voltage to be converted and a voltage stored in the second capacitor is supplied to the D.C. amplifier, and
a fourth counter for measuring the period after a combined voltage of the second reference voltage and a voltage stored in the first capacitor is supplied to the D.C. amplifier until the comparator generates an output signal by a counting a clock pulse generated from the clock-pulse generator.

6. An analog-digital converter according to claim 5 wherein the switch control circuit further comprises a calculator for obtaining a digital quantity of the unknown analog voltage to be converted on the basis of an output signal generated by the fourth counter.

7. An analog-digital converter according to claim 5 wherein the switch control circuit further comprises a delay circuit for automatically clearing the first, second, third and fourth counters and the calculator.

8. An analog-digital converter comprising:
a D.C. amplifier;
a first voltage-current converter connected to an input terminal of the D.C. amplifier,
a first switching circuit for supplying an unknown analog voltage to be converted and first and second analog reference voltages having the same polarity as that of the converted voltage to the first voltage-current converter,
a serial connection circuit of a second switching circuit and a second voltage-current converter connected between the output terminal of the D.C. amplifier and the input terminal of the D.C. amplifier,
a third switching circuit having two switches with one of the switches being connected to an inter-connecting point of the serial connection circuit;
a first capacitor connected between one of the two switches in the third switching circuit and ground to maintain a first voltage corresponding to an output voltage of the D.C. amplifier in the period when only the first reference voltage is supplied to the D.C. amplifier,
a second capacitor connected between one of the switches in the third switching circuit and ground to maintain a second voltage corresponding to an output voltage of the D.C. amplifier during the period when only the second reference voltage is supplied to the D.C. amplifier,
a comparator for producing an output signal when the levels of the output voltage of the D.C. amplifier are equal to the level of a reference voltage,
a fourth switching circuit connected between the input terminal of the comparator and an output terminal of the D.C. amplifier,
a feed-back capacitor connected between the input terminal of the D.C. amplifier and the input terminal of the comparator, and
a switch control circuit for controlling the first, second and third switching circuits to maintain the first and second voltages corresponding to the output voltages of the D.C. amplifier respectively in the first and second capacitors, to supply a first combined voltage of the second voltage corresponding to the output voltage of the D.C. amplifier and the unknown analog voltage to be converted to the D.C. amplifier for a predetermined period, to supply a second combined voltage of the first voltage corresponding to the output voltage of the D.C. amplifier and the second reference voltage to the D.C. amplifier and to obtain a digital quantity of the unknown analog voltage to be converted by measuring the period in which the second combined voltage is supplied to the D.C. amplifier.

* * * * *